United States Patent
Ni et al.

(10) Patent No.: US 11,973,108 B2
(45) Date of Patent: Apr. 30, 2024

(54) SEMICONDUCTOR DEVICE AND MANUFACTURING METHOD THEREOF

(71) Applicants: NISSAN MOTOR CO., LTD., Yokohama (JP); RENAULT s.a.s., Boulogne-Billancourt (FR)

(72) Inventors: Wei Ni, Kanagawa (JP); Tetsuya Hayashi, Kanagawa (JP); Keiichiro Numakura, Kanagawa (JP); Toshiharu Marui, Kanagawa (JP); Ryouta Tanaka, Kanagawa (JP); Yuichi Iwasaki, Kanagawa (JP)

(73) Assignees: NISSAN MOTOR CO., LTD., Yokohama (JP); RENAULT S.A.S., Boulogne-Billancourt (FR)

( * ) Notice: Subject to any disclaimer, the term of this patent is extended or adjusted under 35 U.S.C. 154(b) by 0 days.

(21) Appl. No.: 18/039,610

(22) PCT Filed: Dec. 1, 2020

(86) PCT No.: PCT/IB2020/000995
§ 371 (c)(1),
(2) Date: May 31, 2023

(87) PCT Pub. No.: WO2022/118055
PCT Pub. Date: Jun. 9, 2022

(65) Prior Publication Data
US 2024/0055475 A1   Feb. 15, 2024

(51) Int. Cl.
*H01L 29/06* (2006.01)
*H01L 29/16* (2006.01)
(Continued)

(52) U.S. Cl.
CPC ...... *H01L 29/0638* (2013.01); *H01L 29/1608* (2013.01); *H01L 29/4236* (2013.01); *H01L 29/66704* (2013.01); *H01L 29/7835* (2013.01)

(58) Field of Classification Search
CPC ............. H01L 29/0638; H01L 29/1608; H01L 29/4236; H01L 29/66704; H01L 29/7835
(Continued)

(56) References Cited

U.S. PATENT DOCUMENTS

| 4,007,478 A | 2/1977 | Yagi |
| 2005/0077591 A1 | 4/2005 | Fukuda et al. |

(Continued)

FOREIGN PATENT DOCUMENTS

| DE | 10 2004 014 928 A1 | 10/2005 |
| JP | 2004-022769 A | 1/2004 |

(Continued)

OTHER PUBLICATIONS

Ogyun Seok et al., "High-voltage lateral double-implanted MOSFETs implemented on high-purity semi-insulating 4H-SiC substrates with gate field plates", Japanese Journal of Applied Physics, Jun. 2018 (online publication May 24, 2018), pp. 1-5, vol. 57, No. 6S1 (06HC08), https://doi.org/10.7567/JJAP.57.06HC08 (6 pages).

*Primary Examiner* — Fazli Erdem
(74) *Attorney, Agent, or Firm* — Foley & Lardner LLP

(57) ABSTRACT

A semiconductor device includes: a drift region that is arranged on a main surface of a substrate, and has a higher impurity concentration than the substrate; a first well region that is connected to the drift region; and a second well region that is arranged adjacent to the first well region and faces the drift region. The second well region has a higher impurity concentration than the first well region. A distance between the source region that faces the drift region via the first well region and the drift region is greater than a distance between the second well region and the drift region, in a direction parallel to the main surface of the substrate. A depletion layer extending from the second well region reaches the drift region.

8 Claims, 10 Drawing Sheets

(51) Int. Cl.
*H01L 29/423* (2006.01)
*H01L 29/66* (2006.01)
*H01L 29/78* (2006.01)

(58) Field of Classification Search
USPC .......................................................... 257/335
See application file for complete search history.

(56) References Cited

U.S. PATENT DOCUMENTS

| | | |
|---|---|---|
| 2005/0098846 A1 | 5/2005 | Nagaoka |
| 2006/0199344 A1* | 9/2006 | Tanaka ................ H01L 29/7816 |
| | | 257/E29.066 |
| 2020/0020775 A1 | 1/2020 | Ni et al. |

FOREIGN PATENT DOCUMENTS

| | | |
|---|---|---|
| JP | 2004-335990 A | 11/2004 |
| JP | 2005-079339 A | 3/2005 |
| JP | 2006-245517 A | 9/2006 |
| JP | 2010-028054 A | 2/2010 |

\* cited by examiner

SEMICONDUCTOR DEVICE AND MANUFACTURING METHOD THEREOF

TECHNICAL FIELD

The present invention relates to a semiconductor device in which an inversion layer is formed, and a manufacturing method thereof.

BACKGROUND ART

Transistors having a planar structure are used, in which a gate electrode facing a source region, a base region, and a drain region via a gate insulating film is arranged on the surface of a semiconductor substrate. By applying a prescribed voltage to the gate electrode using the potential of the source region as a reference potential, an inversion layer is formed in the base region immediately below the gate electrode, and thus the transistor is switched to ON. For such transistors having a planar structure, a transistor structure and a manufacturing method thereof have been proposed to ensure a breakdown voltage in the OFF state.

CITATION LIST

Non-Patent Literature

Ogyun Soek etc. "High-voltage lateral double-implanted MOSFETs implemented on high-purity semi-insulating 4H—SiC substrates with gate field plates" Japanese Journal of Applied Physics, Volume 57, Number 6S1 Jun. 2018

SUMMARY OF THE INVENTION

Technical Problem

The impurity concentration in a base region that forms an inversion layer (channel) of a transistor having a planar structure needs to be somewhat low. This makes it difficult to sufficiently reduce the capacitance between a gate electrode and a drain electrode. As a result, switching loss increases.

An object of the present invention is to provide a semiconductor device that is capable of suppressing a decrease in a breakdown voltage in an OFF-state and an increase in switching loss, and a method of manufacturing the semiconductor device.

Technical Solution

A semiconductor device according to an aspect of the present invention has a structure in which a first well region having an inversion layer formed therein and a second well region having a higher impurity concentration than the first well region are arranged between a source region and a drift region. A semiconductor substrate onto which the drift region is arranged has a lower impurity concentration than that of the drift region.

Advantageous Effect of the Invention

The present invention makes it possible to provide a semiconductor device that is capable of suppressing a decrease in a breakdown voltage in an OFF-state and an increase in switching loss, and a method of manufacturing the semiconductor device.

DESCRIPTION OF EMBODIMENTS

Figure 1:
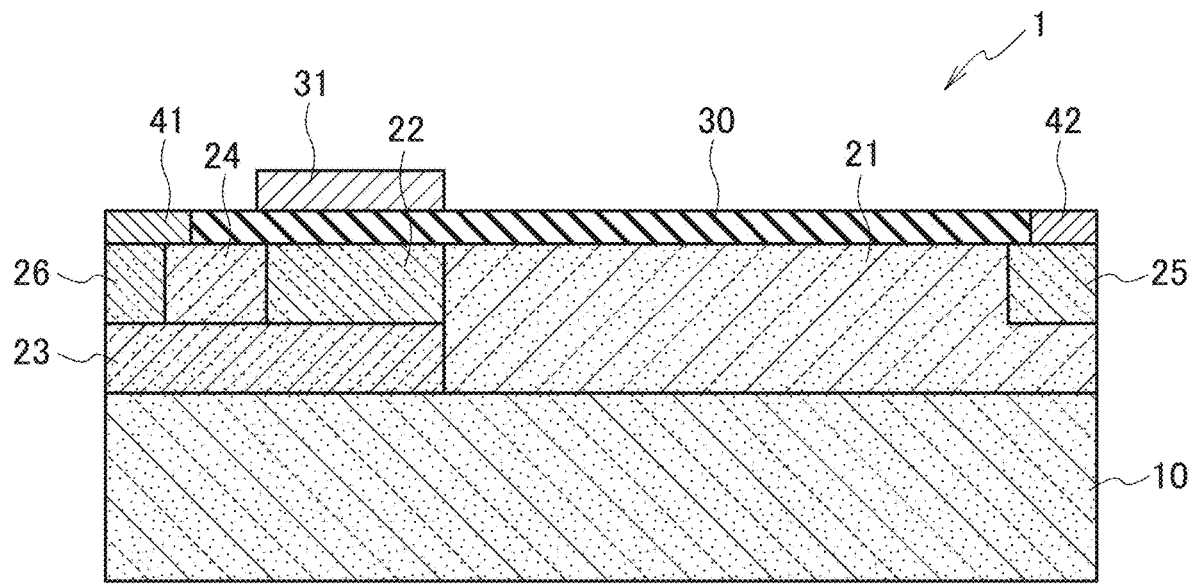
FIG. 1 is a schematic cross-sectional view illustrating a configuration of a semiconductor device according to a first embodiment of the present invention.

Embodiments of the present invention will be described below with reference to the drawings. The same elements illustrated in the drawings are denoted by the same reference numerals, and overlapping descriptions are not repeated below. The drawings are illustrated schematically, and relationships between thicknesses and planar dimensions, and proportions of the thicknesses of the respective layers are not drawn to scale. It should also be understood that the relationships or proportions of the dimensions between the respective drawings can differ from each other.

First Embodiment

As illustrated in FIG. 1, a semiconductor device 1 according to a first embodiment of the present invention includes: a first-conductivity-type drift region 21; a second-conductivity-type first well region 22; and a second-conductivity-type second well region 23. The drift region 21 is selectively arranged on the main surface of the substrate 10. The first well region 22 and the second well region 23 are arranged adjacent to each other in a remaining region of the main surface of the substrate 10 other than the region in which the drift region 21 is arranged. In the semiconductor device 1 illustrated in FIG. 1, the first well region 22 and the second well region 23 are stacked along the film thickness direction of the substrate 10. That is, the second well region 23 is arranged on the main surface of the substrate 10, and the first well region 22 stacked on the second well region 23 is arranged above the main surface of the substrate 10. The side surface of the first well region 22 and the side surface of the second well region 23 are connected to the drift region 21.

The substrate 10 may be a semiconductor substrate, or a semi-insulating substrate, or an insulating substrate. Here, the insulating substrate is a semiconductor substrate having resistivity of several kΩ/cm or more. For example, the substrate 10 is an insulating silicon carbide substrate.

The semiconductor device 1 includes: a first-conductivity-type source region 24 arranged on the upper surface of the second well region 23; and a first-conductivity-type drain region 25 connected to the drift region 21. The source region 24 is connected to the first well region 22 and the second well region 23, and faces the drift region 21 via the first well region 22. The drain region 25 is formed in a part of the upper part of the drift region 21 at a position separated from the first well region 22 and the second well region 23. Further, the semiconductor device 1 includes a second-conductivity-type contact region 26 that is arranged on the upper surface of the second well region 23 and electrically connected to the source region 24 and the second well region 23. The contact region 26 is adjacent to the source region 24 and arranged on the upper surface of the second well region 23. Thus, the second well region 23 is arranged between the substrate 10, and the first well region 22, the source region 24 and the contact region 26.

The first-conductivity-type is a reverse conductivity type of the second-conductivity-type. That is, when the first-conductivity-type is an n-type, the second-conductivity-type is a p-type. When the first-conductivity-type is a p-type, the second-conductivity type is an n-type. A description will be given regarding the case in which the first-conductivity-type is an n-type and the second-conductivity-type is a p-type.

A gate insulating film 30 is arranged on the surfaces of the drift region 21, the first well region 22, and the source region 24. The semiconductor device 1 includes a gate electrode 31 that faces the drift region 21, the first well region 22, and the source region 24 via the gate insulating film 30. The gate electrode 31 is formed of, for example, a polysilicon film. The gate insulating film 30 is formed of, for example, a silicon oxide film.

The semiconductor device 1 includes: a source electrode 41 electrically connected to the source region 24 and the contact region 26, and a drain electrode 42 electrically connected to the drain region 25. The source electrode 41 is arranged on the upper surfaces of the source region 24 and the contact region 26. The drain electrode 42 is arranged on the upper surface of the drain region 25. A part of the second well region 23 may extend in the film thickness direction of the substrate 10, and the second well region 23 and the source electrode 41 may be connected to each other without interposing the contact region 26.

In the semiconductor device 1, the distance between the source region 24 and the drift region 21 is greater than the distance between the second well region 23 and the drift region 21, in the direction parallel to the main surface of the substrate 10. The distance between the second well region 23 and the drift region 21 is set such that the depletion layer extending from the second well region 23 reaches the drift region 21.

In addition, the first well region 22 of the semiconductor device 1 has a higher impurity concentration than that of the substrate 10. Moreover, the second well region 23 has a higher impurity concentration than that of the first well region 22.

The semiconductor device 1 illustrated in FIG. 1 is a transistor having a planar structure in which a gate electrode 31 which faces the source region 24, the first well region 22, and the drain region 25 is arranged on the surface of the substrate 10 via the gate insulating film 30. At the time of the ON operation, an inversion layer is formed in the region in contact with the gate insulating film 30 of the first well region 22 (hereafter also referred to as a "channel region"). The operation of the semiconductor device 1 will be described below.

In the ON operation, a positive potential is applied to the drain electrode 42 with reference to the potential of the source electrode 41. The source electrode 41 is electrically connected to the source region 24, the first well region 22, the contact region 26, and the second well region 23. For this reason, the source region 24, the first well region 22, the contact region 26, and the second well region 23 are all reference potentials.

In a state in which the potentials of the source electrode 41 and the drain electrode 42 are set as described above, the potential of the gate electrode 31 is controlled. Thus, the semiconductor device 1 operates as a transistor. That is, an inversion layer is formed in the channel region of the first well region 22 by setting the voltage between the gate electrode 31 and the source electrode 41 to a predetermined threshold voltage or more. This switches the semiconductor device 1 ON, and the main current flows between the source electrode 41 and the drain electrode 42. At this time, the potential of the drain electrode 42 is, for example, 1 V or less, depending on the ON-resistance of the semiconductor device 1.

In contrast, in the OFF operation, the voltage between the gate electrode 31 and the source electrode 41 is set below a predetermined threshold voltage. As a result, the inversion layer of the first well region 22 disappears and the main current is cut off between the source electrode 41 and the drain electrode 42. In the process of lowering the voltage applied to the gate electrode 31, a voltage of, for example, 1 V or less to several hundred V is applied between the drain electrode 42 and the source electrode 41.

Due to the voltage applied between the source electrode 41 and the drain electrode 42, a depletion layer without free electrons and free holes spreads toward the inner side of the drift region 21 from each surface of the drift region 21 opposing the first well region 22, the second well region 23, and the substrate 10. Hereinafter, the surface of the drift region 21 opposing each region is also referred to as an "opposing surface" with respect to each region. That is, the depletion layer spreads to the inner side of the drift region 21 from the surface opposing the first well region 22, or the surface opposing the second well region 23.

The insulation distance between the drain electrode 42 and the gate electrode 31 increases as the depletion layer formed in the drift region 21 increases in width. For this reason, the capacitance value Cgd of the capacitance formed between the gate electrode 31 and the drain electrode 42 (hereafter referred to as "gate-drain capacitance") becomes smaller as the depletion layer formed in the drift region 21 increases in width.

Here, in order to compare with the semiconductor device 1, a semiconductor device 1a of a comparative example illustrated in FIG. 2 will be described. The semiconductor device 1a of the comparative example has a structure in which the source region 24 and the contact region 26 are arranged on the upper part of a well region 22a. The semiconductor device 1a of the comparative example differs from the semiconductor device 1 illustrated in FIG. 1 in that the semiconductor device 1a does not include a second well region 23.

In the semiconductor device 1a, the impurity concentration in the well region 22a cannot be higher than a certain level as an inversion layer is formed in the well region 22a. For example, the impurity concentration in the well region 22a is less than 1E18/cm³.

As described above, the capacitance value Cgd of the gate-drain capacitance becomes smaller as the depletion layer formed in the drift region 21 increases in width. However, since it is difficult to increase the impurity concentration in the well region 22a in the semiconductor device 1a of the comparative example, the depletion layer formed at the interface between the well region 22a and the drift region 21 extends not only to the drift region 21, but also to the well region 22a. For this reason, in the semiconductor device 1a, the capacitance value Cgd is not sufficiently reduced, and thus switching loss is large.

In contrast, in the semiconductor device 1 illustrated in FIG. 1, the impurity concentration in the second well region 23 is higher than that in the first well region 22. Accordingly, the depletion layer spreading from the surface opposing the second well region 23 to the drift region 21 is wider than the depletion layer spreading from the surface opposing the first well region 22 to the drift region 21. For this reason, even when the impurity concentration in the first well region 22 is set to be low in order to form an inversion layer in the first well region 22, it is possible for the depletion layer spreading from the surface opposing the second well region 23 to make the depletion layer in the drift region 21 wider than that in the semiconductor device 1a of the comparative example.

Figure 3:
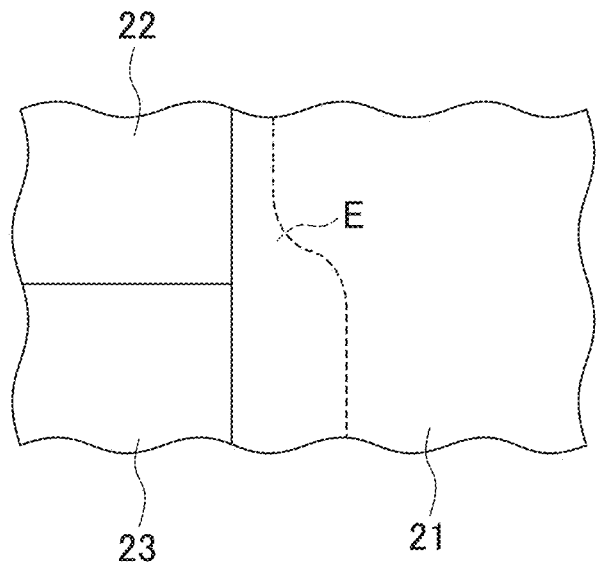
FIG. 3 is a schematic view illustrating an example of a depletion layer formed in a drift region of the semiconductor device according to the first embodiment of the present invention.

That is, as illustrated in FIG. 3, in the semiconductor device 1, the depletion layer E spreading from the surface opposing the second well region 23 to the drift region 21 is wider than the depletion layer E spreading from the surface opposing the first well region 22 to the drift region 21. Thereafter, the depletion layer E spreading from the surface opposing the first well region 22 also spreads to the inner side of the drift region 21 due being pulling by the depletion layer E spreading from the surface opposing the second well region 23.

In the semiconductor device 1 illustrated in FIG. 1, the end surface of the second well region 23 comes into contact with the end surface of the drift region 21. Accordingly, the depletion layer spreading from the surface opposing the second well region 23 to the drift region 21 is particularly wide. However, even when the second well region 23 and the drift region 21 do not come into contact with each other, the depletion layer spreads from the surface opposing the second well region 23 to the drift region 21.

In the semiconductor device 1, the impurity concentration of the substrate 10 is lower than that of the drift region. For this reason, the depletion layer generated on the surface opposing the substrate 10 spreads mainly in the drift region 21 rather than the substrate 10.

Further, in the semiconductor device 1, the distance between the source region 24 and the drift region 21 is greater than the distance between the second well region 23 and the drift region 21, in the direction parallel to the main surface of the substrate 10. That is, the second well region 23 is arranged at a position closer to the drift region 21 than the source region 24. For this reason, the depletion layer generated by the second well region 23 reaches the drift region 21. Thus, the depletion layer spreading from the surface opposing the second well region 23 is formed in the drift region 21.

Figure 2:
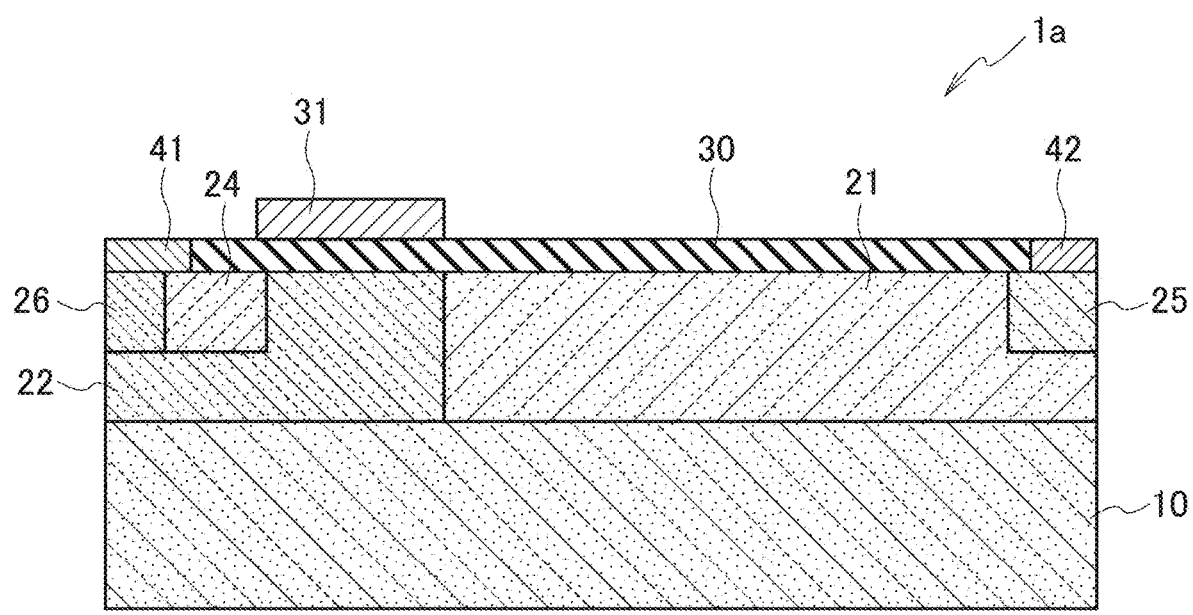
FIG. 2 is a schematic cross-sectional view illustrating a configuration of a semiconductor device in a comparative example.

As described above, in the semiconductor device 1, the depletion layer formed in the drift region 21 is wider than that of the semiconductor device 1a of the comparative example illustrated in FIG. 2. The capacitance value Cgd of the gate-to-drain capacitance has a smaller value in the case in which the depletion layer in the drain region increases in width. For this reason, the semiconductor device 1 makes it possible to suppress switching loss by reducing the capacitance value Cgd.

Figure 4:
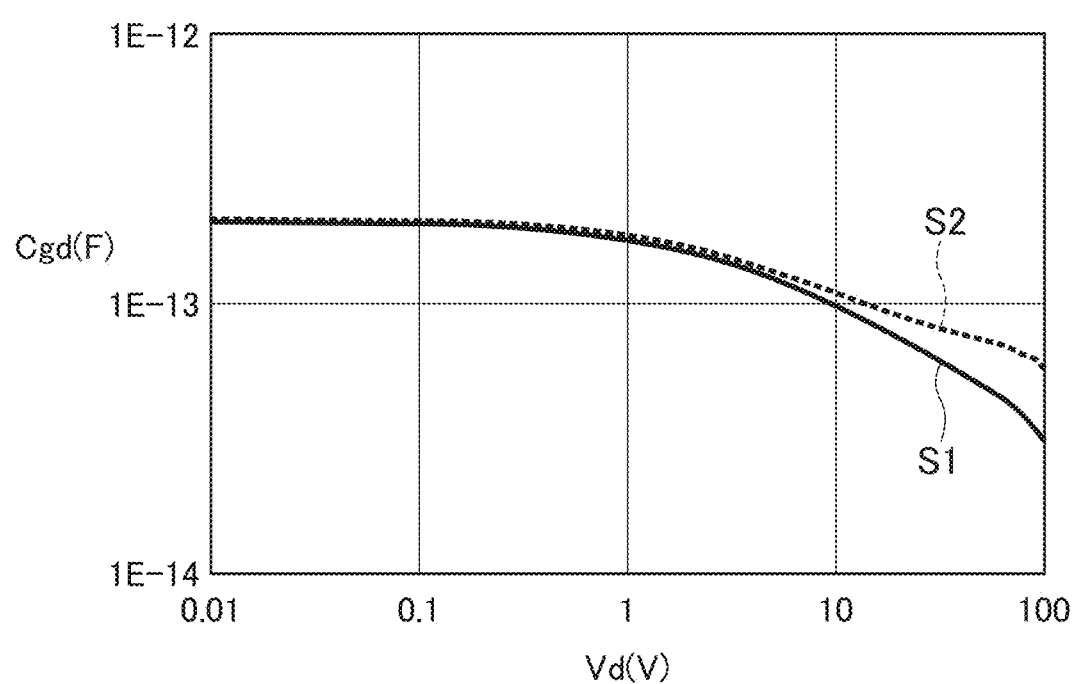
FIG. 4 is a graph illustrating a simulation result obtained by calculating a capacitance value Cgd of a gate-drain capacitance.

FIG. 4 illustrates a simulation result obtained by calculating the capacitance value Cgd of the gate-drain capacitance for each of the semiconductor device 1 and the semiconductor device 1a of the comparative example. FIG. 4 illustrates the simulation result of the semiconductor device 1 with a solid-line characteristic S1, and the simulation result of the semiconductor device 1a of the comparative example with a dashed-line characteristic S2. As illustrated in FIG. 4, the capacitance value Cgd of the semiconductor device 1 is smaller than that of the semiconductor device 1a, especially as the drain voltage Vd increases.

Figure 5:
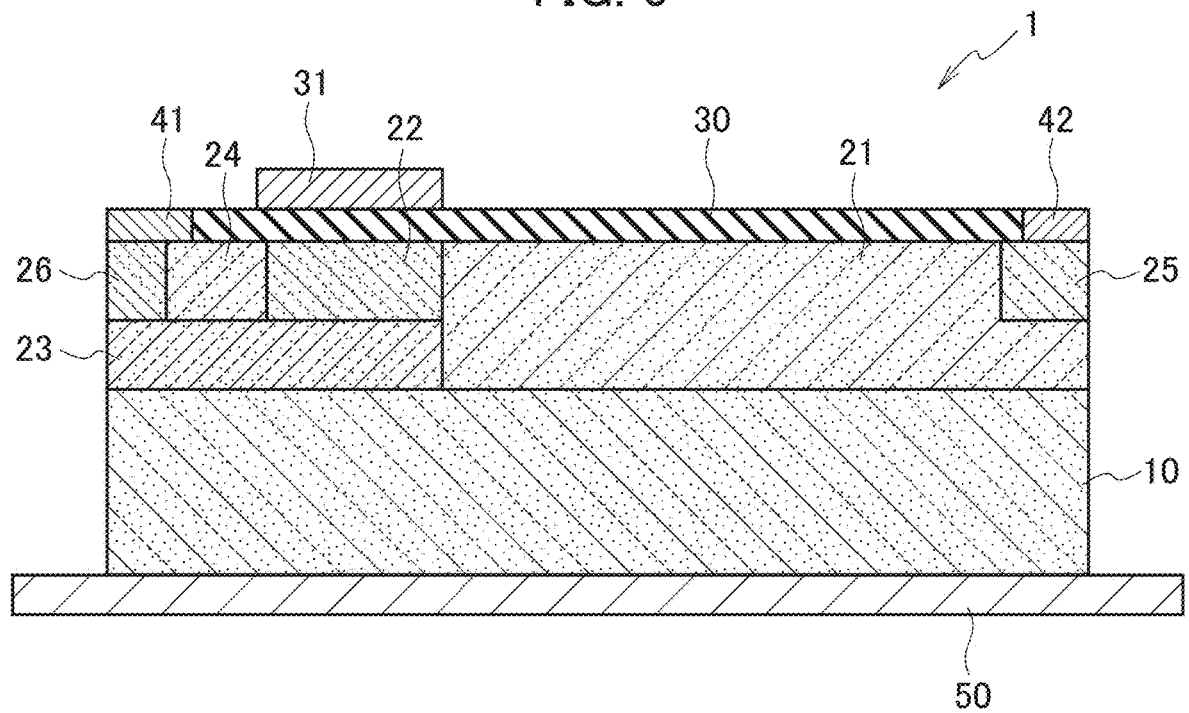
FIG. 5 is a schematic diagram illustrating the configuration of the semiconductor device having a cooler.

For example, as illustrated in FIG. 5, when a metal cooler 50 is mounted on the bottom surface of the substrate 10 of the semiconductor device 1, a capacity (hereafter referred to as "substrate capacity") is formed between the drain electrode 42 and the cooler 50. For example, when the semiconductor device 1 is used as a power transistor, the semiconductor device 1 is generally fixed to the metal cooler. The noise generated when the semiconductor device 1 is switched to ON and OFF propagates through the substrate capacity to the mounting substrate on which the semiconductor device 1 is arranged.

The noise propagated from the semiconductor device 1 to the mounting substrate may cause other semiconductor devices arranged on the mounting substrate to malfunction. As the capacitance value Csub of the substrate capacitance is smaller, the propagated noise is smaller and the chance of malfunction in other semiconductor devices caused by the noise is smaller. The depletion layer formed in the drift region 21 increases in width, the capacitance value Csub is smaller.

Incidentally, the width of the depletion layer formed in the drift region 21 relates to the impurity concentration in the p-type region in contact with the drift region 21. That is, as the concentration of the p-type impurity in the p-type region is higher, the depletion layer in the drift region 21 increases in width.

In the semiconductor device 1a of the comparative example, the impurity concentration in the well region 22a cannot be increased as an inversion layer is formed in the well region 22a. Accordingly, the depletion layer formed at the interface between the well region 22a and the drift region 21 spreads not only to the drift region 21, but also to the well region 22a. For this reason, in the semiconductor device 1a, the substrate capacity is not sufficiently reduced, and thus a malfunction caused by noise may occur in other semiconductor devices.

In contrast, in the semiconductor device 1, the impurity concentration in the drift region 21 is higher than that in the substrate 10. For this reason, the depletion layer spreads mainly in the drift region 21 from the surface opposing the substrate 10. Further, in the semiconductor device 1, the impurity concentration in the second well region 23 is higher than that in the first well region 22. For this reason, the depletion layer spreading from the surface opposing the second well region 23 to the drift region 21 is wider than the depletion layer spreading from the surface opposing the first well region 22 to the drift region 21. Accordingly, the capacitance value Csub of the substrate capacity in the semiconductor device 1 is smaller than that in the semiconductor device 1a of the comparative example that does not include the second well region 23. This makes it possible to improve a system reliability in the system using the semiconductor device 1.

Figure 6:
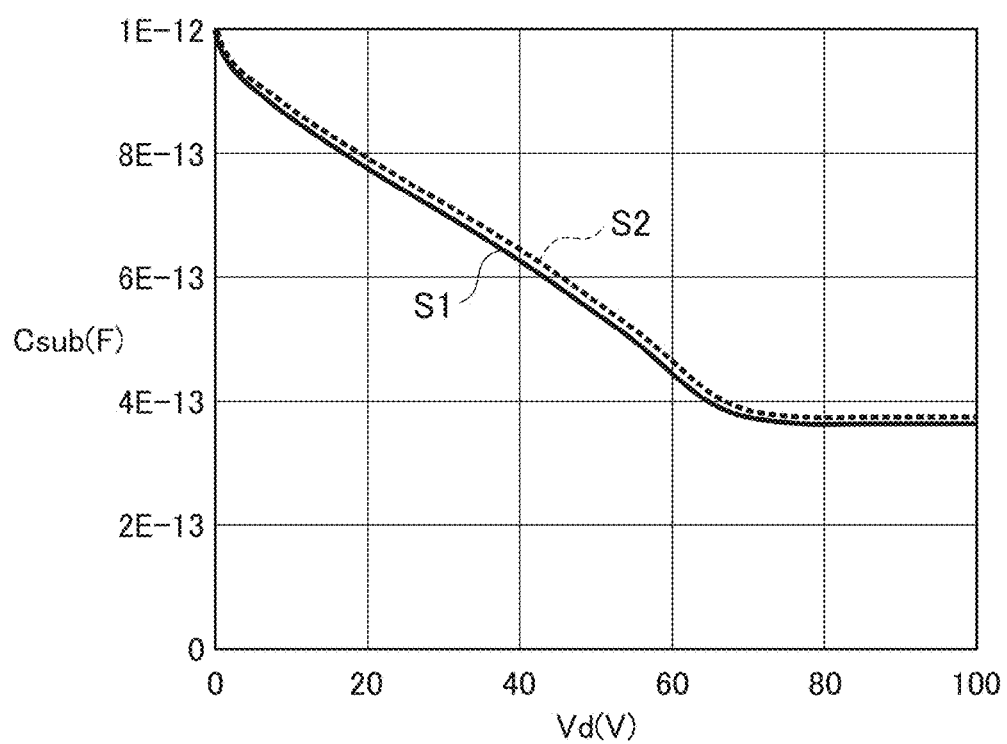
FIG. 6 is a graph illustrating a simulation result obtained by calculating a capacitance value Csub of a substrate capacitance.

FIG. 6 illustrates a simulation result obtained by calculating the capacitance value Csub of the substrate capacity for each of the semiconductor device 1 and the comparative example semiconductor device 1a. FIG. 6 illustrates the simulation result of the semiconductor device 1 with a solid-line characteristic S1, and the simulation result of the semiconductor device 1a of the comparative example with a dashed-line characteristic S2. As illustrated in FIG. 6, the capacitance value Csub of the semiconductor device 1 is smaller than that of the semiconductor device 1a, especially in the region in which the drain voltage Vd changes.

In the semiconductor device 1a of the comparative example, when the body diode formed at the interface between the well region 22a and the drift region 21 operates, the current flows from the source region 24 to the drift region 21 through the well region 22a. For example, when silicon carbide (SiC) is used as a material for the semiconductor device 1a, the electrical resistance of the p-type well region 22a is high because SiC has low hole mobility and a low activation rate of impurities. Further, the current path in the well region 22a is long because the current flows avoiding the periphery of the source region 24. For this reason, the electrical resistance of the body diode of the semiconductor device 1a is large. Thus, the loss of the semiconductor device 1a is large.

In contrast, in the semiconductor device 1, the second well region 23 having a higher impurity concentration than the first well region 22 is arranged adjacent to the first well region 22. The resistance of the body diode is affected by the impurity concentration in the first well region 22 and the second well region 23. The electrical resistance is lower as the impurity concentration is higher, and thus the loss of the body diode is lower. The impurity concentration in the first well region 22 cannot be increased as an inversion layer is formed therein. However, by causing the impurity concentration in the second well region 23 to be higher than that in the first well region 22, the electrical resistance of the body diode of the semiconductor device 1 can be lower than that of the semiconductor device 1a of the comparative example. That is, since the second well region 23 having low electrical resistance is arranged in parallel with the first well region 22, the overall electrical resistance of the body diode formed between the first well region 22 and the second well region 23, and the drift region 21 is reduced. For this reason, the loss of the semiconductor device 1 is smaller than that of the semiconductor device 1a of the comparative example that does not include the second well region 23.

For example, the case in which the semiconductor device 1 is used for the transistors of the inverter which converts a DC signal to an AC signal will be studied below. At the dead time when the transistors in the upper and lower arms of the inverter are simultaneously switched to OFF, the current flows through the body diode of the semiconductor device 1. In the dead time, a voltage negative to the reference potential is applied to the drain electrode 42 with the potential of the source electrode 41 as a reference potential. For this reason, the current flows to the PN diode composed of the first well region 22 and the drift region 21, and to the PN diode composed of the second well region 23 and the drift region 21. When the semiconductor device 1 is used for the transistors of the inverter, the electrical resistance of the body diode can be reduced. Accordingly, the loss of the inverter can be reduced.

As described above, the semiconductor device 1 according to the first embodiment of the present invention has an arrangement structure in which the second well region 23 having a higher impurity concentration than the first well region 22 is adjacent to the first well region 22. For this reason, in the semiconductor device 1, the depletion layer formed in the drift region 21 can be wider. As a result, the semiconductor device 1 makes it possible to suppress switching loss by reducing the capacitance value Cgd of the gate-drain capacitance. According to the semiconductor device 1 in which the end surface of the second well region 23 and the end surface of the drift region 21 come into contact with each other, the depletion layer formed in the drift region 21 can be particularly wider. In addition, the semiconductor device 1 makes it possible to suppress noise caused by the substrate capacity by reducing the capacitance value Csub of the substrate capacity, thereby making it possible to improve the reliability of the system including the semiconductor device 1. Further, the semiconductor device 1 makes it possible to suppress loss by reducing the electrical resistance of the body diode.

A semi-insulating substrate or an insulating substrate may be used for the substrate 10. This makes the depletion layer spreading from the surface opposing the substrate 10 to the drift region 21 wider than in the case in which the substrate 10 is a semiconductor substrate. For this reason, the use of the semi-insulating substrate or the insulating substrate for the substrate 10 makes it possible to further reduce the capacitance value Cgd and the capacitance value Csub. In addition, the insulating property of the substrate 10 makes it possible to reduce switching loss and noise of the semiconductor device 1 by reducing the capacitance value Csub. Further, since the semi-insulating substrate or the insulating substrate is used for the substrate 10, it is possible to simplify the element separation process when a plurality of semiconductor devices 1 are integrated on the same substrate 10. Moreover, when mounting the semiconductor device 1 on the cooler, the insulating substrate provided between the substrate 10 and the cooler can be omitted.

A substrate composed of a wide-bandgap semiconductor may be used for the substrate 10. The wide-bandgap semiconductor has a low intrinsic carrier concentration and can increase the insulating property of the substrate 10. For this reason, the capacitance value Cgd and the capacitance value Csub can be reduced by increasing the width of the depletion layer in the drift region 21. This makes it possible to reduce switching loss and noise of the semiconductor device 1. In addition, when the semiconductor device 1 having the semiconductor substrate 10 composed of the wide-bandgap semiconductor is fixed to the metal cooler, the leakage current flowing through the cooler can be reduced, thereby making it possible to realize the low-loss semiconductor device 1. The wide-bandgap semiconductor is, for example, SiC, gallium nitride (GaN), diamond, zinc oxide (ZnO), aluminum gallium nitride (AlGaN), or the like.

For example, an insulating silicon carbide substrate (SiC substrate) may be used for the substrate 10. Since the carrier mobility of p-type SiC is low, the use of such a SiC substrate for the substrate 10 is effective in reducing the electrical resistance of the body diode. Further, since SiC has a large thermal conductivity, the size of the cooler can be reduced or the connection between the semiconductor device 1 and the cooler can be simplified, when the semiconductor device 1 is fixed to the cooler. Several polytypes (crystal polymorphs) exist in SiC, and a typical 4H—SiC substrate can be used for the substrate 10.

A method of manufacturing the semiconductor device 1 according to the first embodiment of the present invention will be described below with reference to the drawings. The method of manufacturing the semiconductor device 1 described below is merely an example, and may be realized by various other manufacturing methods including a modification example of the present method. A description will be given regarding the case in which an insulating silicon carbide substrate is used for the substrate 10.

Figure 7:
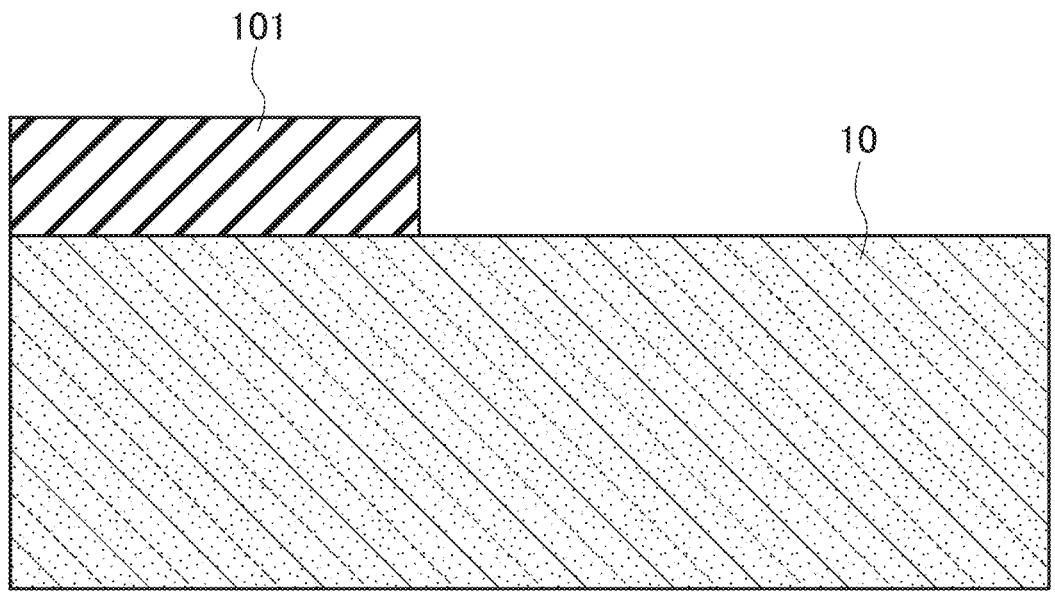
FIG. 7 is a schematic cross-sectional view for describing a method of manufacturing the semiconductor device according to the first embodiment of the present invention (part 1).

First, as illustrated in FIG. 7, the mask material 101 formed on the main surface of the substrate 10 is patterned to cover the region other than the region in which the drift region 21 is formed.

As a general mask material, for example, a silicon oxide film may be used. As a deposition method of the mask material, a thermal CVD method, or a plasma CVD method may be used. A photolithography technique may be used as a method of patterning. That is, the mask material is etched using the patterned photoresist film as a mask. As the etching method, a wet etching method using hydrofluoric acid, or a dry etching method such as a reactive ion etching method may be used. Thereafter, the photoresist film is removed by using oxygen plasma, sulfuric acid, or the like. In this way, the mask material is patterned (the same shall apply hereinafter).

Figure 8:
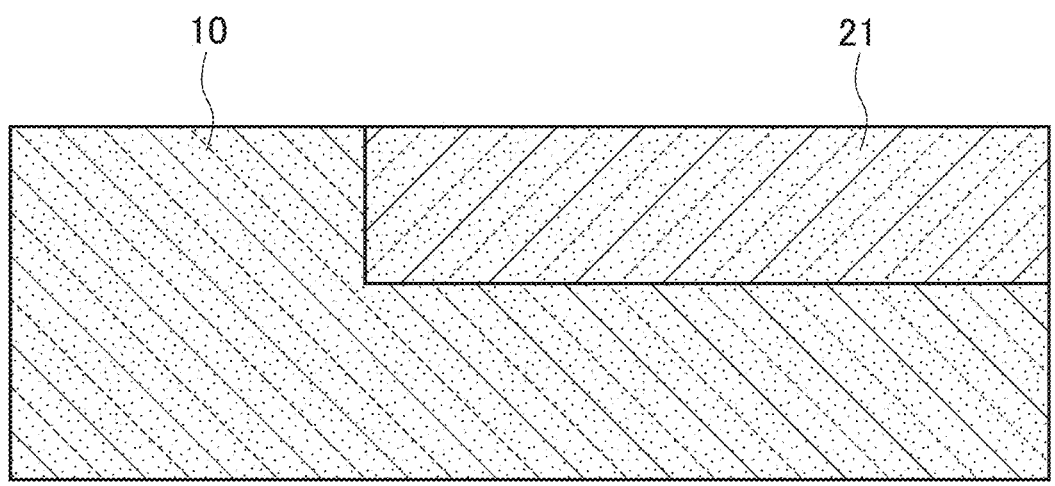
FIG. 8 is a schematic cross-sectional view for describing the method of manufacturing the semiconductor device according to the first embodiment of the present invention (part 2).

Next, the substrate 10 is doped with n-type impurities by an ion implantation method using the patterned mask material 101 as a mask to selectively form the drift region 21. For example, n-type impurities are used as nitrogen to form the drift region 21 with a depth of 1 micrometer and an impurity concentration of 1E16 cm$^{-3}$. FIG. 8 illustrates the state where the mask material 101 is removed after the drift region 21 is formed.

Figure 9:
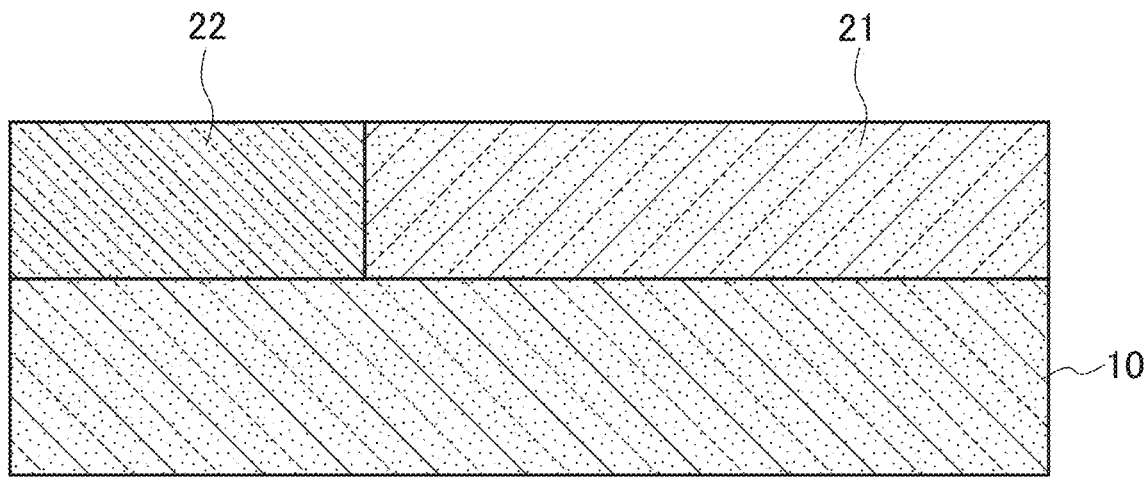
FIG. 9 is a schematic cross-sectional view for describing the method of manufacturing the semiconductor device according to the first embodiment of the present invention (part 3).

P-type impurities are then doped into the substrate 10 by the ion implantation method using the patterned mask material as a mask to form the first well region 22, as illustrated in FIG. 9. For example, p-type impurities are used as aluminum to form the first well region 22 with a depth of 0.8 micrometers and an impurity concentration of 1E17 cm$^{-3}$.

Figure 10:
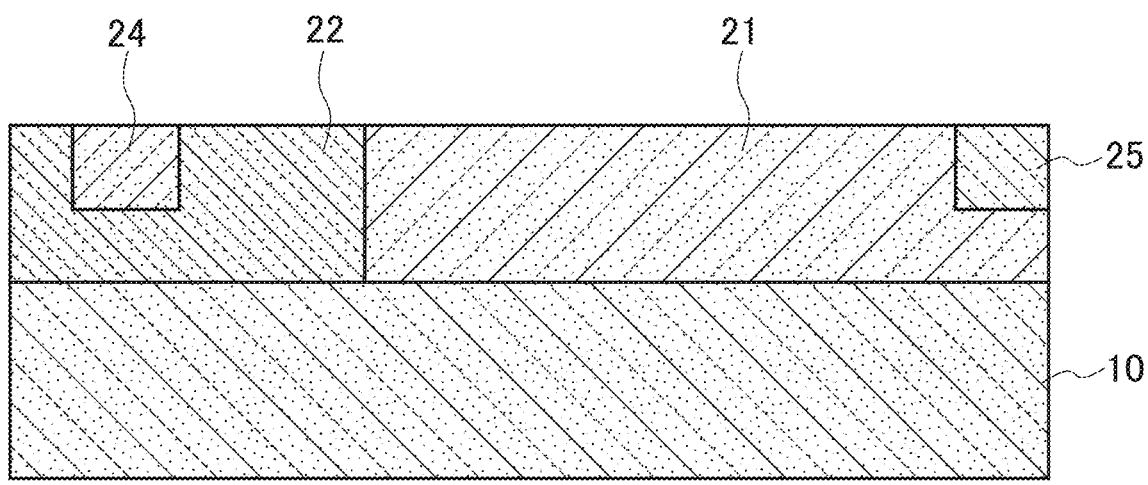
FIG. 10 is a schematic cross-sectional view for describing the method of manufacturing the semiconductor device according to the first embodiment of the present invention (part 4).

Further, the source region 24 and the drain region 25 are formed as illustrated in FIG. 10. At this time, the source region 24 and the drain region 25 may be formed simultaneously by the ion implantation method using the patterned mask material as a mask. For example, nitrogen ions are used for n-type impurities to form the source region 24 and the drain region 25 with a depth of 0.5 micrometers and an impurity concentration of 1E19 cm$^{-3}$. As illustrated in FIG. 10, the source region 24 is selectively formed on the upper part of the first well region 22. The drain region 25 is formed on the upper part of the drift region 21 at a position separated from the first well region 22 and the second well region 23.

Figure 11:
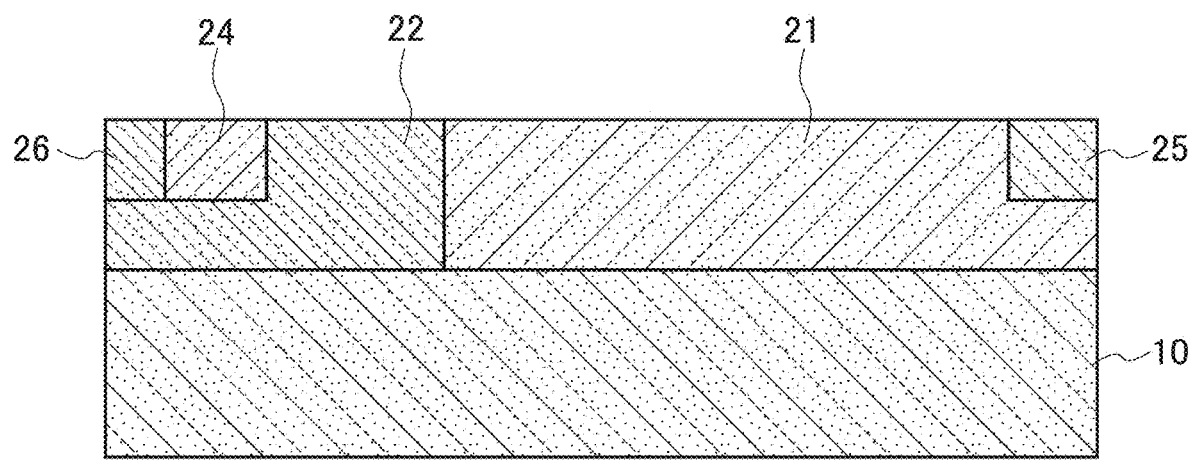
FIG. 11 is a schematic cross-sectional view for describing the method of manufacturing the semiconductor device according to the first embodiment of the present invention (part 5).

Thereafter, the contact region 26 is formed as illustrated in FIG. 11 by the ion implantation method in which p-type impurities are selectively doped into the first well region 22. For example, aluminum ions as p-type impurities are injected into a predetermined region of the first well region 22 to form the contact region 26 with a depth of 0.5 micrometers and an impurity concentration of 1E20 cm$^{-3}$.

Figure 12:
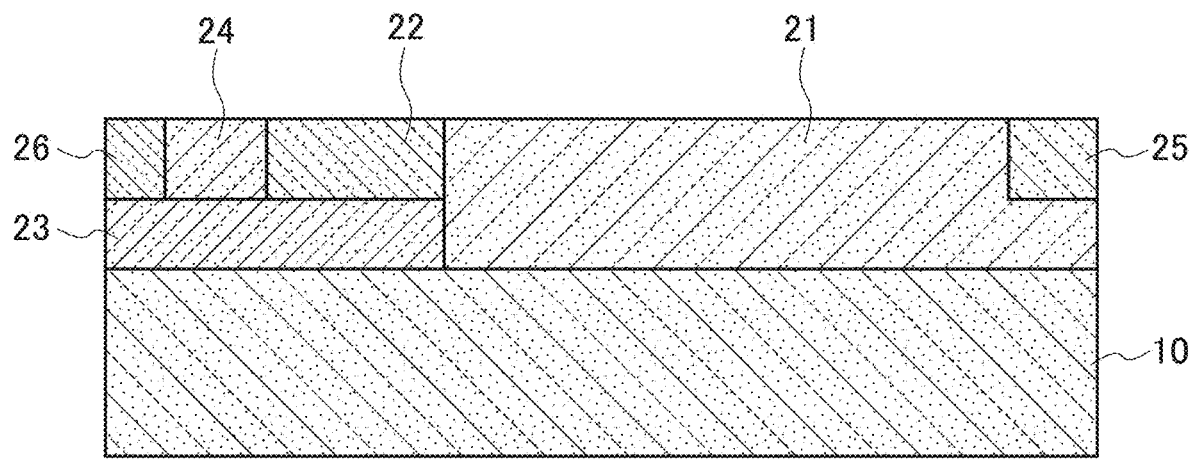
FIG. 12 is a schematic cross-sectional view for describing the method of manufacturing the semiconductor device according to the first embodiment of the present invention (part 6).

Next, as illustrated in FIG. 12, the second well region 23 is formed. For example, p-type impurities are doped at the bottom of the first well region 22 to form the second well region 23 by the ion implantation method using the patterned mask material as a mask. At this time, the position of the second well region 23 in the film thickness direction of the substrate 10 is set by appropriately setting the implantation energy of ion implantation. For example, the second well region 23 with an impurity concentration of 1E19 cm$^{-3}$ is formed in the depth range of 0.5 micrometers to 1 micrometer from the substrate surface. The formation conditions of the second well region 23 are set such that the lower surfaces of the source region 24 and the contact region 26 are connected to the second well region 23.

Thereafter, the impurities doped into the substrate 10 are activated by heat treatment. For example, heat treatment at about 1700° C. is performed in an argon atmosphere or a nitrogen atmosphere.

In the ion implantation method described above, the depth and impurity concentration of each region are set according to the application of the semiconductor device 1. For example, nitrogen is used as an n-type impurity, and aluminum or boron is used as a p-type impurity. Incidentally, the formation of crystal defects in the ion-implanted region can be suppressed by performing ion implantation in a state in which the temperature of the substrate 10 is heated to about 600° C. In addition, uniform impurity concentration distribution in the depth direction can be realized by adopting box implantation as a method of ion implantation. Hereinafter, the substrate 10 into which the impurities are doped to form each region is also referred to as a "base substrate".

Figure 13:
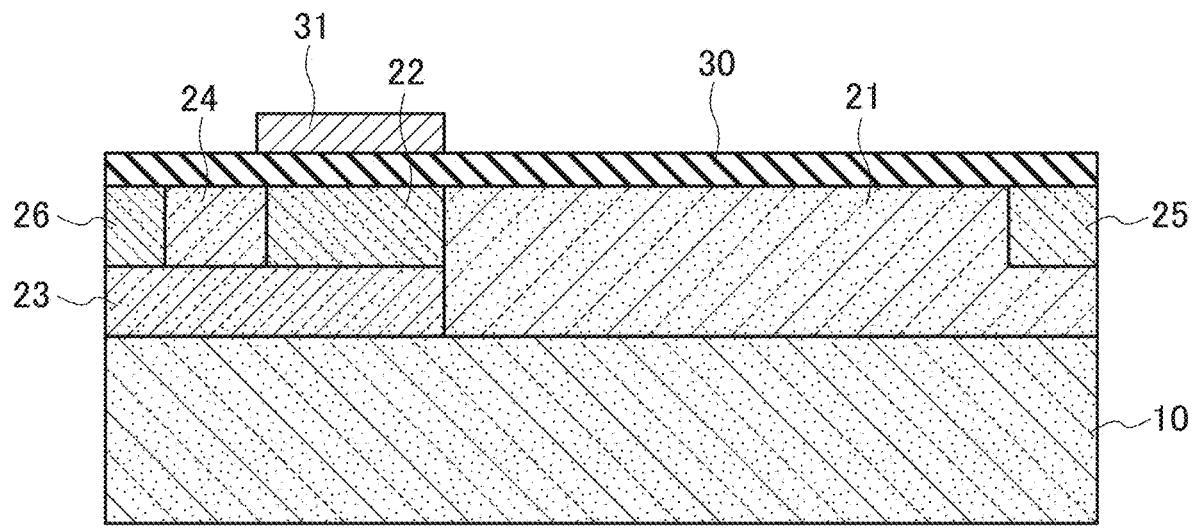
FIG. 13 is a schematic cross-sectional view for describing the method of manufacturing the semiconductor device according to the first embodiment of the present invention (part 7).

Next, as illustrated in FIG. 13, the gate insulating film 30 and the gate electrode 31 are formed. The method of forming the gate insulating film 30 may be a thermal oxidation method, or a deposition method. When the gate insulating film 30 is formed by the thermal oxidation method, the base substrate is heated to a temperature of about 1100° C. in an oxygen atmosphere. This results in the formation of a silicon oxide film in all parts where the base substrate is exposed to oxygen. Alternatively, the gate insulating film 30 may be formed by thermal oxidation in an NO or N20 atmosphere. In this case, the temperature is preferably between 1100° C. and 1400° C. The gate insulating film 30 has a thickness of, for example, about several tens of nm. The thickness of the gate insulating film can be set appropriately according to the application of the semiconductor device 1.

After the gate insulating film 30 is formed, the gate electrode 31 is formed on a part of the upper surface of the gate insulating film 30. The material of the gate electrode 31 is generally a polysilicon film. Herein, a description will be given regarding the case in which a polysilicon film is used for the gate electrode 31. As the deposition method of the polysilicon film, a low-pressure CVD method, or the like may be used. The gate electrode 31 may have a thickness of, for example, around 1 micrometer. After the polysilicon film is deposited, it is annealed in phosphorus oxychloride ($POCl_3$) at 950° C. to form an n-type polysilicon film, which causes the gate electrode 31 to have conductivity. Thereafter, the formed polysilicon film is etched to form the gate electrode 31 into a predetermined shape. The etching method may be either an isotropic etching method, or an anisotropic selective etching method. The etching mask may be a resist film. After the polysilicon film is etched, the resist film of the etching mask is removed by oxygen plasma, sulfuric acid, or the like.

Next, the source electrode 41 and the drain electrode 42 are formed using, for example, a lift-off method. When the lift-off method is used, a resist film is formed on the gate insulating film 30, and this resist film is patterned by photolithography technique, or the like. Specifically, the resist film is removed in the region in which the source electrode 41 and the drain electrode 42 are arranged. Thereafter, the gate insulating film is etched using the patterned resist film as an etching mask. For example, the etching method may be a wet etching method using hydrofluoric acid, or a dry etching method such as reactive ion etching. Thereafter, a conductive material used as an electrode material is deposited on the entire surface of the base substrate. The conductive material may be, for example, a nickel film, or any other metal material. The resist film is then removed with acetone, or the like. Thus, the semiconductor device 1 illustrated in FIG. 1 is completed.

The method of manufacturing the semiconductor device described above makes it possible to manufacture the semiconductor device 1 according to the first embodiment. According to the semiconductor device 1, it is possible to make the depletion layer formed in the drift region 21 wider. Accordingly, the semiconductor device 1 makes it possible to suppress switching loss by reducing the capacitance value Cgd of the gate-drain capacitance. In addition, the semiconductor device 1 makes it possible to suppress noise caused by the substrate capacity by reducing the capacitance value Csub of the substrate capacity. Further, the semiconductor device 1 makes it possible to suppress loss by reducing the electrical resistance of the body diode.

In the above manufacturing method, the second well region 23 is formed after the process of forming the first well region 22, the source region 24, and the contact region 26. However, the first well region 22, the source region 24, and the contact region 26 may be formed after the process of forming the second well region 23.

Modification Example

Figure 14:
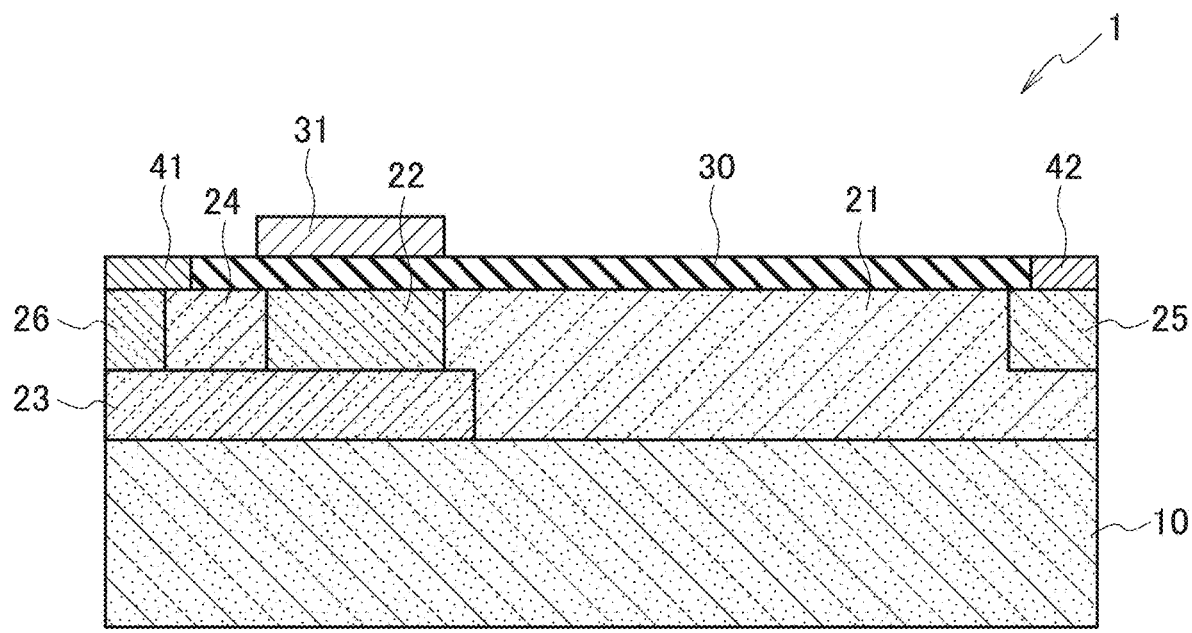
FIG. 14 is a schematic cross-sectional view illustrating a configuration of a semiconductor device according to a modification example of the first embodiment of the present invention.

In the semiconductor device 1 according to a modification example of the first embodiment illustrated in FIG. 14, a part of the second well region 23 overlaps with the drift region 21 when viewed from the normal direction of the main surface of the substrate (hereafter referred to as "planar view"). That is, in the direction along the main surface of the substrate 10, the position of the junction between the second well region 23 and the drift region 21 is closer to the drain region 25 than the position of the junction between the first well region 22 and the drift region 21.

Figure 15:
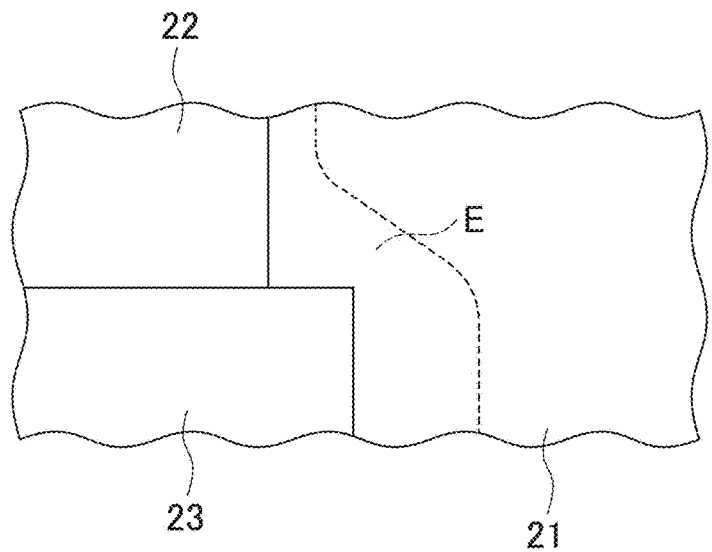
FIG. 15 is a schematic view illustrating an example of a depletion layer formed in a drift region of the semiconductor device according to the modification example of the first embodiment of the present invention.

In the semiconductor device 1 illustrated in FIG. 14, the end portion of the depletion layer spreading from the surface opposing the second well region 23 is closer to the drain region 25 than that of the semiconductor device 1 illustrated in FIG. 1. For this reason, as illustrated in FIG. 15, the range of the depletion layer E spreading from the surface opposing the first well region 22 to the drift region 21 spreads due to being pulling by the depletion layer E spreading from the surface opposing the second well region 23 to the drift region 21. As a result, the depletion layer formed in the drift region 21 in the semiconductor device 1 illustrated in FIG. 14 is wider than that in the semiconductor device 1 illustrated in FIG. 1. Accordingly, the semiconductor device 1 illustrated in FIG. 14 makes it possible to make the capacitance value Cgd and the capacitance value Csub smaller than those of the semiconductor device 1 illustrated in FIG. 1. This makes it possible to further reduce switching loss and noise of the semiconductor device 1.

Second Embodiment

Figure 16:
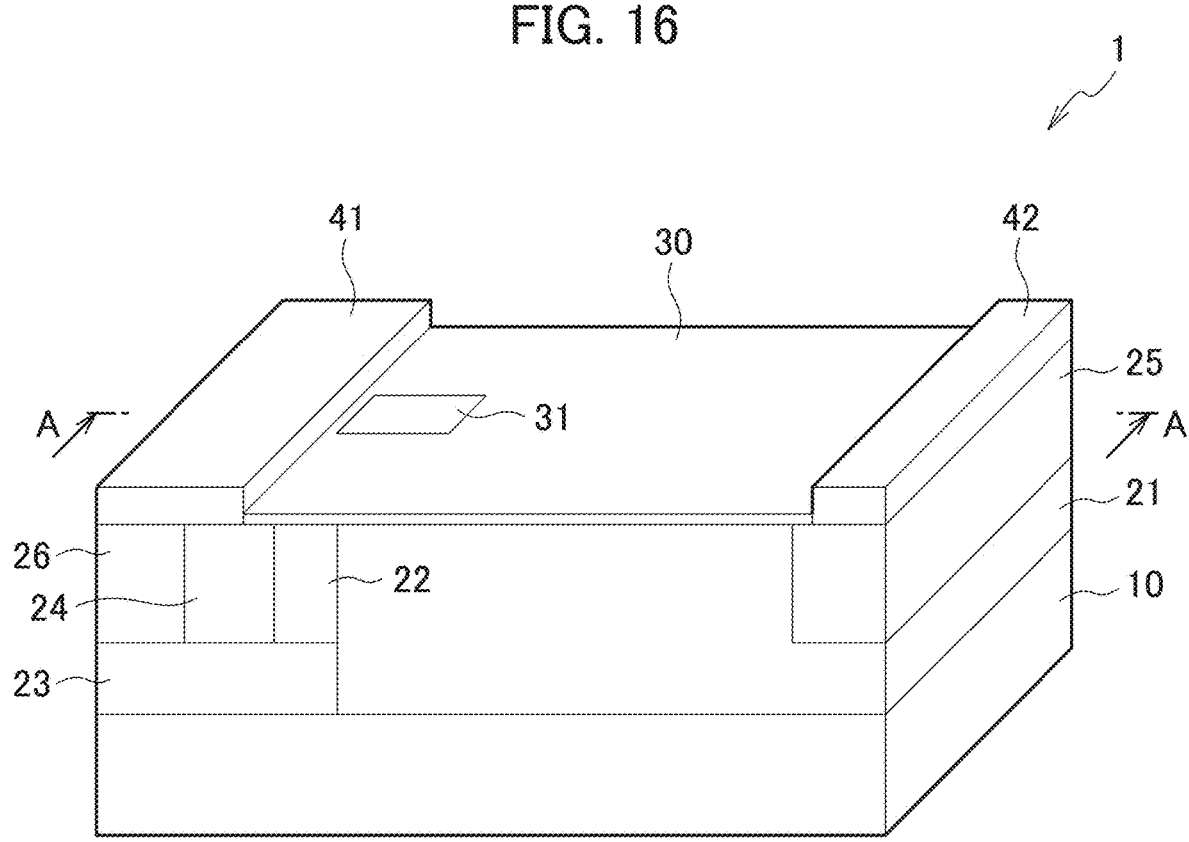
FIG. 16 is a schematic perspective view illustrating a configuration of a semiconductor device according to a second embodiment of the present invention.

In the semiconductor device 1 according to a second embodiment of the present invention illustrated in FIG. 16, the gate insulating film 30 is arranged in the inner wall surface of a groove. In the inner wall surface of the groove, the side surfaces come into contact with the drift region 21, the first well region 22, and the source region 24, and the lower ends reach the second well region 23. In addition, the gate electrode 31 is arranged inside the groove. The semiconductor device 1 according to the second embodiment differs from the first embodiment in that the gate electrode 31 is arranged at the inner side of the groove provided in the base substrate (hereafter, referred to as a "gate groove"). In other configurations, the semiconductor device 1 illustrated in FIG. 16 is the same as those of the semiconductor device 1 according to the first embodiment.

Figure 17:
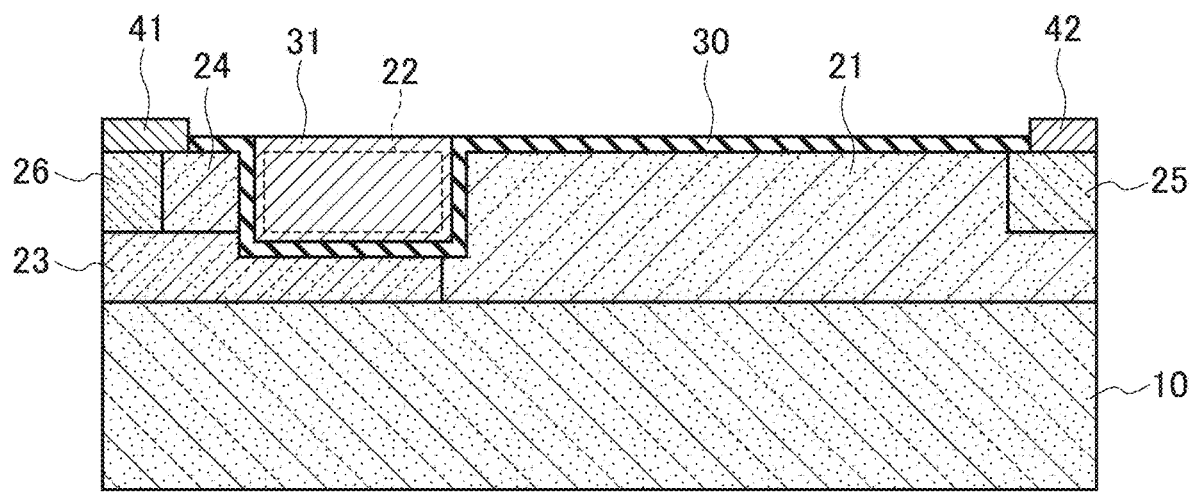
FIG. 17 is a schematic cross-sectional view illustrating the configuration of the semiconductor device according to the second embodiment of the present invention.

The opening of the gate groove in the upper surface of the base substrate extends over the source region 24, the first well region 22, and the drift region 21. FIG. 17 illustrates a cross-sectional view along the A-A direction of FIG. 16. As illustrated in FIG. 17, the side surfaces of the gate groove come into contact with the source region 24, the first well region 22, and the drift region 21. The gate electrode 31 embedded inside the gate groove faces the drift region 21, the first well region 22 and the source region 24 in the side surfaces of the gate groove, via the gate insulating film 30.

In the semiconductor device 1 illustrated in FIG. 16, an inversion layer is formed in the channel region in contact with the side surfaces of the gate groove in the first well region 22 at the time of the ON-operation of the semiconductor device 1. For this reason, as the gate groove into which the gate electrode 31 is embedded is deeper, the inversion layer increases in width. Accordingly, in the semiconductor device 1 illustrated in FIG. 16, by forming the gate groove deeper in the first well region 22, it is possible to increase the inversion layer in width without increasing the size of the semiconductor device 1 in planar view, thereby reducing the channel resistance. Thus, the semiconductor device 1 illustrated in FIG. 16 makes it possible to reduce switching loss of the semiconductor device 1 by reducing the channel resistance, in addition to the effect obtained by reducing the capacitance value Cgd and the capacitance value Csub described in the first embodiment. The other configurations are substantially the same as those in the first embodiment, and the descriptions thereof are omitted.

A method of manufacturing the semiconductor device 1 according to the second embodiment will be described below. The method of manufacturing the semiconductor device 1 described below is merely an example, and may be realized by various other manufacturing methods including a modification example of the present method. Further, a detailed description of the part that overlaps with the method of manufacturing the semiconductor device 1 according to the first embodiment will be omitted. A description will be given regarding the case in which an insulating silicon carbide substrate is used for the substrate 10.

Figure 18:
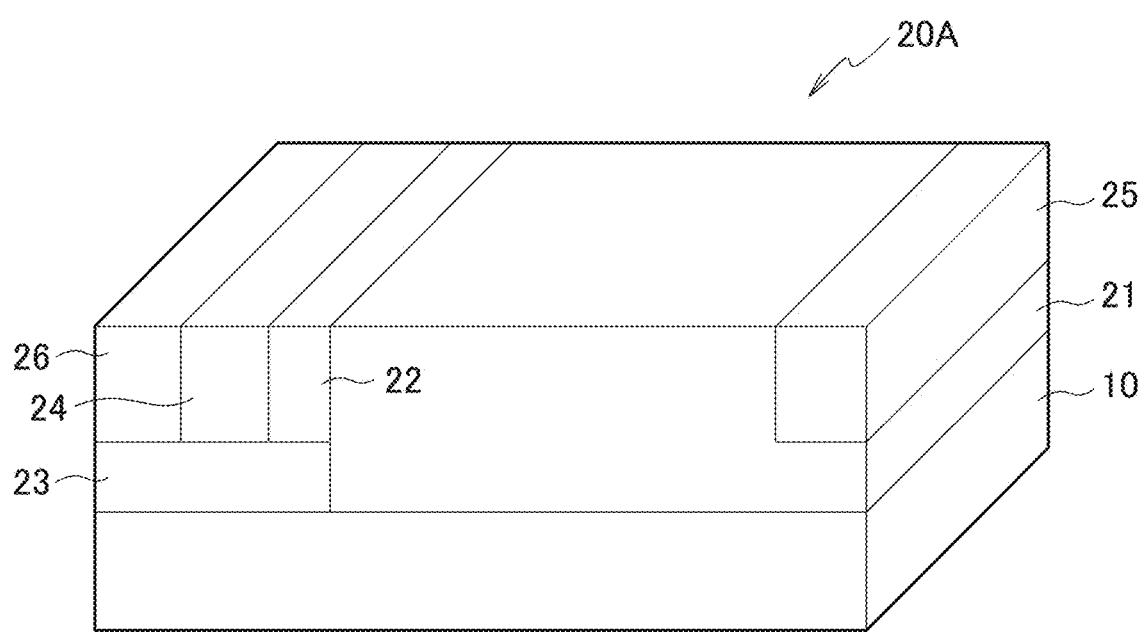
FIG. 18 is a schematic cross-sectional view for describing a method of manufacturing the semiconductor device according to the second embodiment of the present invention (part 1).

First, the drift region 21, the first well region 22, the source region 24, the drain region 25, the contact region 26, and the second well region 23 are formed on the substrate in the same method as described with reference to FIGS. 7 to 12. As a result, a base substrate 20A illustrated in FIG. 18 is formed.

Figure 19:
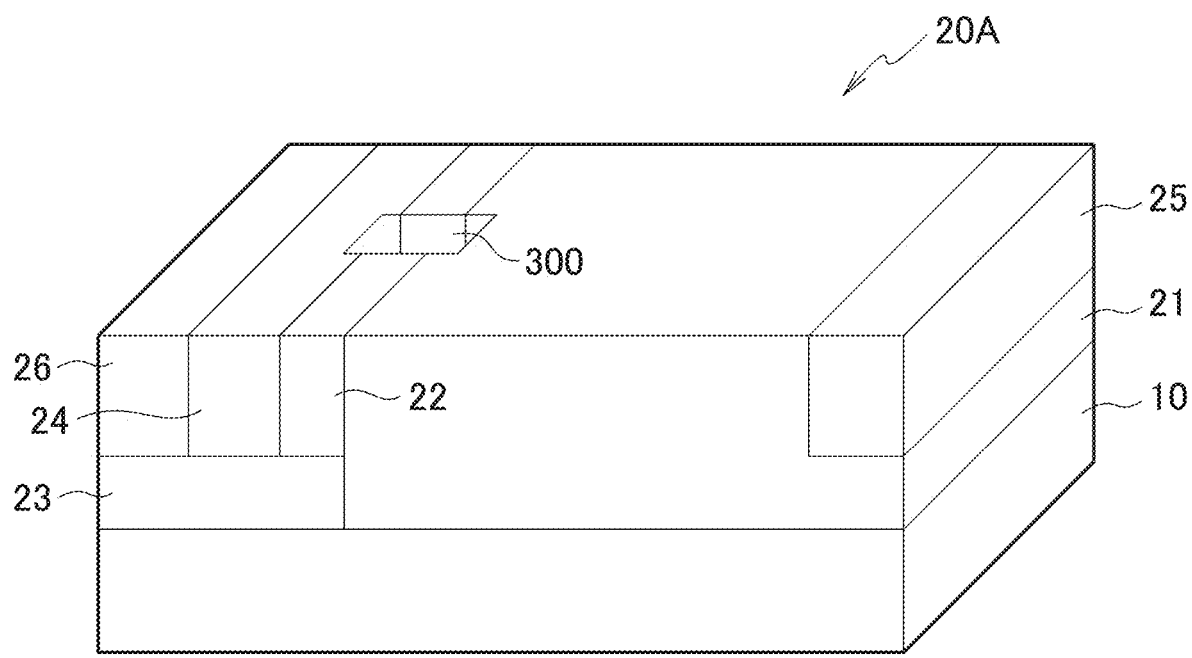
FIG. 19 is a schematic cross-sectional view for describing the method of manufacturing the semiconductor device according to the second embodiment of the present invention (part 2)

Next, as illustrated in FIG. 19, a gate groove 300 having an opening that extends over the source region 24, the first well region 22, and the drift region 21 in the upper surface of the base substrate 20A is formed in the base substrate 20A. The gate groove 300 is formed such that the lower ends reach the second well region 23. For example, an anisotropic etching method using a mask material patterned by photolithography technique is used to form the gate groove 300. As a method of forming the gate groove 300, a dry etching method is preferably used for the substrate 10 which is a silicon carbide substrate.

After the gate groove 300 is formed, the gate insulating film 30 is formed in such a way as to cover the inner wall surface of the gate groove 300 and the upper surface of the base substrate 20A. The gate insulating film 30 may be formed by either thermal oxidation, or deposition.

Next, the gate electrode 31 is formed by embedding the inner side of the gate groove 300. For example, a polysilicon film is used for the gate electrode 31. As a deposition method of the polysilicon film, a low-pressure CVD method, or the like may be used. For example, the thickness of the polysilicon film to be deposited is set to a value greater than ½ of the width of the gate groove 300, and the inner side of the gate groove 300 is embedded with the polysilicon film. Since the polysilicon film is formed from the inner wall surface of the gate groove 300, the gate groove 300 can be completely embedded with the polysilicon film by setting the thickness of the poly silicon film as described above. For example, when the gate groove 300 has a width of 2 micrometers, the polysilicon film is formed such that the polysilicon film has a film thickness of 1 micrometer or more. After the polysilicon film is deposited, it is annealed in phosphorus oxychloride ($POCl_3$) at 950° C. to form an n-type polysilicon film, which causes the gate electrode 31 to have conductivity. Thereafter, the formed polysilicon film is etched to form the gate electrode 31 into a predetermined shape.

Thereafter, the source electrode 41 and the drain electrode 42 are formed using, for example, a lift-off method. Thus, the semiconductor device 1 illustrated in FIG. 16 is completed.

Other Embodiments

The embodiments of the present invention have been described above, but the statements and drawings forming part of this disclosure should not be understood as limiting the invention. Various alternative embodiments, examples, and operating techniques will be apparent to those skilled in the art from this disclosure.

For example, although a description has been given to an example in which an n-type polysilicon film is used for the gate electrode 31, a p-type polysilicon film may be used for the gate electrode 31. In addition, other semiconductor materials may be used for the gate electrode 31, or other conductive materials such as metal materials may be used for the gate electrode 31. For example, p-type poly silicon carbide, SiGe, Al, or the like may be used as the material of the gate electrode 31.

Although a description has been given to an example in which a silicon oxide film is used for the gate insulating film 30, a silicon nitride film may be used for the gate insulating film 30. Alternatively, a stacked film of silicon oxide and silicon nitride may be used for the gate insulating film 30. Isotropic etching when a silicon nitride film is used for the gate insulating film 30 may be performed by washing with thermal phosphoric acid at 160° C.

It should be understood that the present invention includes various embodiments not described herein.

LIST OF REFERENCE NUMERALS

1: Semiconductor device
10: Substrate
21: Drift region
22: First well region
23: Second well region
24: Source region
25: Drain region
26: Contact region
30: Gate insulating film
31: Gate electrode
41: Source electrode
42: Drain electrode
50: Cooler

The invention claimed is:

1. A semiconductor device comprising:
a substrate;
a first-conductivity-type drift region that is selectively arranged on a main surface of the substrate, and has a higher impurity concentration than the substrate;
a second-conductivity-type first well region that is arranged above the main surface in a remaining region of the main surface other than a region in which the drift region is arranged, and that is connected to the drift region;
a second-conductivity-type second well region that is adjacent to the first well region along a thickness direction of the substrate, arranged on the remaining surface and faces the drift region, and has a higher impurity concentration than the first well region;
a first-conductivity-type source region that is connected to the first well region and the second well region, and faces the drift region via the first well region;
a first-conductivity-type drain region that is connected to the drift region at a position separated from the first well region and the second well region;
a gate insulating film that is arranged on surfaces of the drift region, the first well region, and the source region; and
a gate electrode that faces the drift region, the first well region, and the source region via the gate insulating film, wherein a distance between the source region and the drift region is greater than a distance between the second well region and the drift region, in a direction parallel to the main surface of the substrate, and a depletion layer extending from the second well region reaches the drift region.

2. The semiconductor device according to claim 1, wherein the gate insulating film is arranged in an inner wall surface of a groove in which side surfaces come into contact with the drift region, the first well region, and the source region, and lower ends reach the second well region, and the gate electrode is arranged inside the groove.

3. The semiconductor device according to claim 1, wherein the substrate is a semi-insulating substrate or an insulating substrate.

4. The semiconductor device according to claim 1, wherein an end surface of the second well region comes into contact with an end surface of the drift region.

5. The semiconductor device according to claim 1, wherein a part of the second well region overlaps with a part of the drift region in planar view.

6. The semiconductor device according to claim 1, wherein the substrate is composed of a wide-bandgap semiconductor.

7. The semiconductor device according to claim 6, wherein the substrate is a silicon carbide substrate.

8. A method of manufacturing a semiconductor device comprising:

a step of selectivity forming on a main surface of a substrate, a first-conductivity-type drift region that has a higher impurity concentration than the substrate;

a step of forming a second-conductivity-type first well region above the main surface in a remaining region of the main surface other than a region in which the drift region is arranged, such that the first well region is connected to the drift region;

a step of forming a second-conductivity-type second well region having a higher impurity concentration than the first well region in the remaining region in such a way as to face the drift region, the second well region being adjacent to the first well region;

a step of forming a first-conductivity-type source region that is connected to the first well region and the second well region in such a way as to face the drift region via the first well region;

a step of forming a first-conductivity-type drain region that is connected to the drift region at a position separated from the first well region and the second well region;

a step of forming a gate insulating film on surfaces of the drift region, the first well region, and the source region; and a step of forming a gate electrode that faces the drift region, the first well region, and the source region via the gate insulating film, wherein a distance between the source region and the drift region is greater than a distance between the second well region and the drift region, in a direction parallel to the main surface of the substrate, and a depletion layer extending from the second well region reaches the drift region.

* * * * *